United States Patent
Chung et al.

(10) Patent No.: US 7,531,861 B2
(45) Date of Patent: May 12, 2009

(54) TRENCH CAPACITORS WITH INSULATING LAYER COLLARS IN UNDERCUT REGIONS

(75) Inventors: Suk-jin Chung, Gyeonggi-do (KR); Seung-hwan Lee, Seoul (KR); Sung-tae Kim, Seoul (KR); Young-sun Kim, Gyeonggi-do (KR); Jae-soon Lim, Seoul (KR); Young-geun Park, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 12/033,065

(22) Filed: Feb. 19, 2008

(65) Prior Publication Data

US 2008/0135876 A1    Jun. 12, 2008

Related U.S. Application Data

(62) Division of application No. 11/037,626, filed on Jan. 18, 2005, now Pat. No. 7,354,821.

(30) Foreign Application Priority Data

Mar. 26, 2004    (KR) .................. 10-2004-0020765

(51) Int. Cl.
    *H01L 29/94*    (2006.01)
(52) U.S. Cl. ............. 257/304; 257/190; 257/296; 257/297; 257/298; 257/299; 257/300; 257/301; 257/302; 257/303
(58) Field of Classification Search ............. 257/304, 257/296–303, 190
    See application file for complete search history.

(56) References Cited

U.S. PATENT DOCUMENTS

| 5,406,515 | A | 4/1995 | Rajeevakumar |
| 6,140,175 | A | 10/2000 | Kleinhenz et al. |
| 6,373,086 | B1 | 4/2002 | Mandelman et al. |
| 6,693,016 | B2 | 2/2004 | Gutsche et al. |

(Continued)

FOREIGN PATENT DOCUMENTS

KR    1020030014832 A    2/2003

*Primary Examiner*—Cuong Q Nguyen
*Assistant Examiner*—Trang Q Tran
(74) *Attorney, Agent, or Firm*—Myers Bigel Sibley & Sajovec, P.A.

(57) ABSTRACT

Trench capacitors that have insulating layer collars in undercut regions and methods of fabricating such trench capacitors are provided. Some methods of fabricating a trench capacitor include forming a first layer on a substrate. A second layer is formed on the first layer opposite to the substrate. A mask is formed that has an opening on top of the first and second layers. A first trench is formed by removing a portion of the first and second layers through the opening in the mask. A portion of the first layer under the second layer is removed to form an undercut region under the second layer. An insulating layer collar is formed in the undercut region under the second layer. A second trench is formed that extends from the first trench by removing a portion of the substrate through the opening in the mask. A buried plate is formed in the substrate along the second trench. A dielectric layer is formed on an inner wall and bottom of the second trench. A storage electrode is formed in the second trench on the dielectric layer.

2 Claims, 17 Drawing Sheets

U.S. PATENT DOCUMENTS

| | | |
|---|---|---|
| 6,770,526 B2 | 8/2004 | Chudzik et al. |
| 7,135,368 B2 | 11/2006 | Kito et al. |
| 7,268,381 B2 | 9/2007 | Birner et al. |
| 2001/0044190 A1 | 11/2001 | Heo et al. |
| 2002/0072171 A1 | 6/2002 | Forster et al. |
| 2003/0020110 A1 | 1/2003 | Tews et al. |
| 2003/0020112 A1 | 1/2003 | Tews et al. |
| 2003/0045068 A1 | 3/2003 | Gutsche et al. |
| 2004/0095896 A1 | 5/2004 | Chudzik et al. |
| 2004/0150037 A1 | 8/2004 | Katsumata et al. |
| 2004/0248364 A1 | 12/2004 | Hsiao et al. |
| 2005/0093044 A1 * | 5/2005 | Cheng et al. ............... 257/296 |
| 2005/0112839 A1 | 5/2005 | Wu |
| 2005/0212026 A1 | 9/2005 | Chung et al. |
| 2005/0224852 A1 | 10/2005 | Cheng et al. |
| 2005/0282393 A1 | 12/2005 | Cheng et al. |
| 2006/0071260 A1 | 4/2006 | Yamasaki |
| 2006/0292789 A1 | 12/2006 | Cheng et al. |
| 2007/0099391 A1 | 5/2007 | Cheng et al. |
| 2007/0117307 A1 | 5/2007 | Cheng et al. |
| 2007/0224757 A1 | 9/2007 | Cheng et al. |
| 2007/0249123 A1 | 10/2007 | Chou et al. |

* cited by examiner

TRENCH CAPACITORS WITH INSULATING LAYER COLLARS IN UNDERCUT REGIONS

CROSS-REFERENCE TO RELATED APPLICATIONS

This application is a divisional of U.S. non-provisional patent application Ser. No. 11/037,626, filed Jan. 18, 2005, now U.S. Pat. No. 7,354,821 which claims priority under 35 U.S.C. § 119 of Korean Patent Application No. 10-2004-0020765 filed on Mar. 26, 2004, in the Korean Intellectual Property Office, the disclosures of both of which are herein incorporated by reference in their entirety.

FIELD OF THE INVENTION

The present invention relates to semiconductor devices and methods of manufacturing the same, and more particularly, to trench capacitors used in dynamic random access memory (DRAM) cells and methods of fabricating the same.

BACKGROUND OF THE INVENTION

DRAM memory cell devices generally contain single transistor memory cells. A single transistor memory cell includes a selection transistor and a memory capacitor. Information is stored in the memory capacitor as electric charges and, under the control of a read transistor through a word line, the information can be read through a bit line.

In order to reliably hold the electric charges and enable information to be read and identified, the memory capacitor should have a high capacitance. However, as integration density increases and the area occupied by the single transistor memory cell is reduced, the area available for the memory capacitor decreases. Thus, it is desirable to have high capacitance in a small area.

One approach to fabricating memory capacitors is to form the memory capacitors within a trench in a substrate. Such trench capacitors can have a smoother surface topography, can be formed using fewer photolithography processes, and can have lower bit line capacitance compared to stack-type capacitors. Accordingly, trench type memory capacitors may be fabricated at a lower cost and may be driven with lower power than stack-type capacitors.

FIG. 1 is a cross-section of a DRAM that includes a conventional trench capacitor. Such a typical trench capacitor DRAM cell is disclosed in, for example, "Trench Capacitor DRAM Cell With Self-aligned Buried Strap", published in IEDM 93-627. A substrate 100 is doped with P-type dopants. A trench capacitor 160 includes a trench etched deeply into the substrate 100, and N-type doped polysilicon 161 that fills the trench. The N-type doped polysilicon 161 serves as a top electrode (storage electrode). An N-type doped region 165 covers the bottom of the trench and serves as a bottom electrode. The N-type doped region 165 is also referred to as a buried plate. A dielectric layer 164 insulates the buried plate 165 and the N-type doped polysilicon 161. A buried N-type well 170 isolates a P-type well 151 from the substrate 100 and serves as a conduction bridge connecting the buried plates 165.

The DRAM cell also includes a transistor 110. The transistor 110 includes a gate 112 and diffusion regions 113 and 114. The diffusion regions 113 and 114 separated by a channel 117 are formed by implanting N-type dopants, such as phosphorous (P). A node diffusion region 125, also referred to as a node junction, couples the trench capacitor 160 to the transistor 110. The node diffusion region 125 is formed by out diffusion of dopants from the N-type doped polysilicon 161 that fills the trench via a buried strap 162.

By providing appropriate voltage to the gate 112 and a bit line 185 and activating the transistor 110, the trench capacitor 160 is accessed. Generally, the gate 112 forms a word line, and the diffusion region 113 is coupled to the bit line 185 in the DRAM cell array via a contact 183. The bit line 185 is insulated from the diffusion region 113 by an interlayer insulating layer 189.

Shallow trench isolation (STI) 180 is provided to insulate the DRAM from another cell or device. As illustrated in FIG. 1, a word line 120 is formed on a top portion of the trench and is insulated by the STI 180. The word line 120 is also known as a passing word line.

In addition, an insulating layer collar 168 is used to inhibit/prevent node junction leakage to the buried plate 165. Leakage decreases a time for sustaining cells and increases a refresh frequency, which lowers efficiency. A process of forming the insulating layer collar 168 includes deposition and local oxidation of silicon (LOCOS).

Common and well-known processes of forming the buried plate 165 include thermal diffusion, gas phase doping, and plasma immersion ion implantation, in which dopants are caused to diffuse out into the substrate 100 at the bottom of the trench.

A process for forming a buried plate of the trench capacitor using conventional thermal diffusion and a process of forming a collar using oxide layer deposition are illustrated in FIGS. 2A through 2D. First, as illustrated in FIG. 2A, a pad oxide layer 2 and a hard mask 4 are formed on a substrate 1. Then, a trench 6 is formed using the hard mask 4.

In FIG. 2B, a doped insulating layer 12, such as an arsenosilicate glass (ASG), is formed on the inner wall and bottom of the trench 6. Then, the bottom of the trench 6 is filled with photoresist 14. As a result, the doped insulating layer 12 on the top inner wall of the trench 6 remains exposed.

The doped insulating layer 12 on the top of the trench 6 is removed by etching. Thus, a doped insulation layer 12a remains only at the bottom portion of the trench 6. Then, a cap oxide layer, such as teraethylorthosilicate (TEOS) layer, is deposited on the trench 6. The cap oxide layer is recessed to expose the photoresist 14, thereby forming a collar 16. This process is illustrated in FIG. 2C.

Referring to FIG. 2D, after removing the photoresist 14 of FIG. 2C, a diffusion region 18 is formed by impurities inside the doped insulating layer 12 diffusing into the substrate 1 through a thermal process on the doped insulting layer 12 and other layers. This diffusion region 18 is a buried plate.

Afterwards, the rest of the process is performed to form the structure illustrated in FIG. 1. A trench capacitor that is fabricated according to the processes described above may use more than seven process operations to form the collar 16 and the buried plate 18. Also, the ASG can include an organic precursor such as TEOS and triethylarsenate (TEAS) or triethylorthoacetate (TEOA). It may be difficult to use ASG in a low-pressure chemical vapor deposition (LPCVD) process because these precursors can cause defects and non-uniformity in the substrate. Moreover, ASG can be relatively expensive.

A process for forming a buried plate of a trench capacitor using conventional gas phase doping or plasma immersion ion implantation, and forming a collar using a LOCOS process, are illustrated in FIGS. 3A through 3C. A process for forming a buried strap is illustrated in FIGS. 3D through 3F.

First, as illustrated in FIG. 3A, a pad oxide layer 22 and a hard mask 24 are formed on a substrate 21. Then, a trench 26 is formed using the hard mask 24. After forming an insulating layer, such as a silicon nitride layer, on the inner wall and bottom of the trench 26, the bottom of the trench 26 is filled with photoresist 34. Then, the insulating layer is removed from the top inner wall of the trench 26 by etching. As a result, an oxidation prevention layer 32 remains only at the bottom portion of the trench 26, and the top inner wall of the trench 26 is exposed.

Next, as illustrated in FIG. 3B, after removing the photoresist 34 of FIG. 3A, a LOCOS-type collar 36 is formed by oxidizing the exposed inner wall of the trench 26.

The oxidation prevention layer 32 is removed as shown in FIG. 3C. Here, the trench 26 of FIG. 3B may be expanded to form a trench 26a with a larger bottom width. Then, a buried plate 38 is formed on the inner walls and at the bottom of the trench 26a by gas phase doping or a plasma immersion ion implantation process.

Afterwards, the rest of the process is performed to form the structure illustrated in FIG. 1. The gas phase doping and the plasma immersion ion implantation processes may each be simpler than the thermal diffusion process. However, it may be difficult with the gas phase doping and/or the plasma immersion ion implantation processes to maintain a uniform doping profile and at least a predetermined doping density in a trench with a high aspect ratio. Even if the LOCOS process, which is simpler than the deposition and etching to form the collar 36 as shown in FIG. 2C, is used, more than six processes may be needed.

In addition, after forming a dielectric layer (not shown) and doped polysilicon 40 as in FIG. 3D, a buried strap (162 of FIG. 1) that connects a transistor and a capacitor needs to be formed. As illustrated in FIG. 3E, a process is needed to remove a portion of the collar 36 to form collar patterns 36a and then expose regions 42 on which the buried strap is to be formed. Then, a buried strap 44 is formed as illustrated in FIG. 3F.

However, according to the above-mentioned processes, the thickness of the collar 36 may be limited because the oxidation process can only be performed as much as the oxidation prevention layer 32 can endure. Accordingly, current leakage of the buried plate 38 and the buried strap 44 may not be adequately controlled. Furthermore, a separate process is required to form a buried N-type well (170 of FIG. 1) for electrical connection.

SUMMARY OF THE INVENTION

Some embodiments of the present invention provide a method of fabricating trench capacitors. A first layer is formed on a substrate. A second layer is formed on the first layer opposite to the substrate. A mask is formed that has an opening on top of the first and second layers. A first trench is formed by removing a portion of the first and second layers through the opening in the mask. A portion of the first layer under the second layer is removed to form an undercut region under the second layer. An insulating layer collar is formed in the undercut region under the second layer. A second trench is formed that extends from the first trench by removing a portion of the substrate through the opening in the mask. A buried plate is formed in the substrate along the second trench. A dielectric layer is formed on an inner wall and bottom of the second trench. A storage electrode is formed in the second trench on the dielectric layer.

In some further embodiments of the present invention, the substrate can include a silicon substrate, the first layer can include SiGe, the second layer can include Si, and the mask can be an etching mask. The first trench can be formed by etching the Si layer and the SiGe layer using the etching mask. The undercut region may be formed by selectively, isotropically etching a portion of the SiGe layer. The insulating layer collar may be formed by forming an insulating layer in the first trench and the undercut region, and anisotropically etching the insulating layer to at least substantially remove the insulating layer from the first trench. The second trench may be formed by etching the silicon substrate using the etching mask.

In yet some further embodiments of the present invention, the SiGe layer and the Si layer can be formed by epitaxial growth processes. The SiGe layer and the Si layer may be grown by controlling an amount of dopant gas to vary their doping concentration in units of atomic layers. The mask may be formed as one or more layers of Si, $SiO_2$, $Si_3N_4$, SiGe, $Al_2O_3$, and/or $Ta_2O_5$. The undercut region may be formed by dry etching a portion of the SiGe layer using a fluorine-based gas, a chlorine-based gas, He, and/or $O_2$, and/or by wet etching a portion of the SiGe layer using nitric acid, acetic acid, and/or hydrofluoric acid.

In some other embodiments of the present invention, trench capacitors are formed by first forming a lower trench in a substrate. A buried plate is formed in the lower trench. A dielectric layer is formed on the buried plate in the lower trench. A storage electrode is formed on the dielectric layer in the lower trench opposite to the buried plate. A first layer is formed on the substrate. A second layer is formed on the first layer opposite to the substrate. A mask is formed that has an opening on top of the first and second layers. An upper trench is formed that extends from the lower trench through the opening in the mask. A portion of the first layer is removed from under the second layer to form an undercut region under the second layer. An insulating layer collar is formed inside the undercut region under the second layer. The etching mask is then removed.

In some other embodiments of the present invention, trench capacitors are formed by forming a first conduction type-doped Si layer on a silicon substrate. An SiGe layer is formed on the first conduction type-doped Si layer opposite to the substrate. A second conduction type-doped Si layer is formed on the SiGe layer opposite to the first conduction type-doped Si layer. An etching mask is formed that has an opening on top of the second conduction type-doped Si layer. A first trench is formed by etching the second conduction type-doped Si layer and the SiGe layer using the etching mask. A portion of the SiGe layer is removed by selectively, isotropically etching the SiGe layer, to form an undercut region under the SiGe layer. An insulating layer is formed in the first trench and the undercut region. The insulating layer is etched to form an insulating layer collar in the undercut region. A second trench is formed that extends from the first trench by etching a portion of the silicon substrate through the opening in the etching mask. A buried plate is formed in the substrate along the second trench. The etching mask is removed. A dielectric layer is formed on the buried plate in the second trench. A storage electrode is formed on the dielectric layer in the second trench opposite to the buried plate.

In some further embodiments of the present invention, the first conduction type-doped Si layer and the second conduction type-doped Si layer may be formed as in-situ doped Si layers. The second conduction type-doped Si layer may be formed on the SiGe layer by forming the Si layer on the SiGe layer, and doping the Si layer by ion implantation to form the second conduction type-doped Si layer. The first conduction type may be N+ and the second conduction type may be P+. The SiGe layer and the Si layer may be epitaxially grown. The SiGe layer may comprise less than 20% Ge. The etching mask the etching mask is formed as one or more layers of Si, $SiO_2$, $Si_3N_4$, SiGe, $Al_2O_3$, and/or $Ta_2O_5$ formed as one or more layers of Si, $SiO_2$, $Si_3N_4$, SiGe, $Al_2O_3$, and/or $Ta_2O_5$ The insulating layer in the first trench and the undercut region may be formed by deposited the insulating layer by atomic layer deposition, chemical vapor deposition, plasma enhanced atomic layer deposition, plasma enhanced chemical vapor deposition, and/or a coating process.

Some other embodiments of the present invention provide a trench capacitor. The trench capacitor includes a substrate, a first layer, a second layer, a trench, an undercut region, an insulating layer collar, a buried plate, a dielectric layer, and a storage electrode. The first layer is on the substrate. The second layer on the first layer opposite to the substrate. The trench is defined in the first and second layers. The undercut region is defined in the first layer and extends laterally under the second layer. The insulating layer collar is in the undercut region and extends laterally under the second layer. The buried plate is in the substrate along the trench. The dielectric layer is in the trench on the buried plate. The storage electrode is on the dielectric layer in the trench opposite to the buried plate.

In some further embodiments of the present invention, the substrate may include a silicon substrate, the first layer may include a SiGe layer, and the second layer may include a Si layer. The dielectric layer and the storage electrode may extend beyond and away from an adjacent top major surface of the substrate. Top surfaces of the dielectric layer and the storage electrode may be aligned with a top surface of the insulating layer collar, or the top surfaces of the dielectric layer and the storage electrode may be aligned with an adjacent top major surface of the substrate.

Some other embodiments of the present invention also provide a trench capacitor. The trench capacitor includes a silicon substrate, a first conduction type-doped Si layer, an SiGe layer, a second conduction type-doped Si layer, a trench, an undercut region, an insulating layer collar, a buried plate, a dielectric layer, and a storage electrode.

The first conduction type-doped Si layer is on the silicon substrate. The SiGe layer is on the first conduction type-doped Si layer. The second conduction type-doped Si layer is on the SiGe layer opposite to the first conduction type-doped Si layer. The trench is defined in the second conduction type-doped Si layer, the SiGe layer, and the first conduction type-doped Si layer. The undercut region is defined in the SiGe layer and extends laterally along the first and second conduction type-doped Si layers. The insulating layer collar is in the undercut region and extends laterally along the first and second conduction type-doped Si layers. The buried plate is in the first conduction type-doped Si layer along the trench. The dielectric layer is in the trench on the buried plate. The storage electrode is on the dielectric layer in the trench opposite to the buried plate.

Top surfaces of the dielectric layer and the storage electrode may extend beyond and away from an adjacent top surface of the first conduction type-doped Si layer.

DETAILED DESCRIPTION OF EMBODIMENTS ACCORDING TO THE INVENTION

Figure 1:
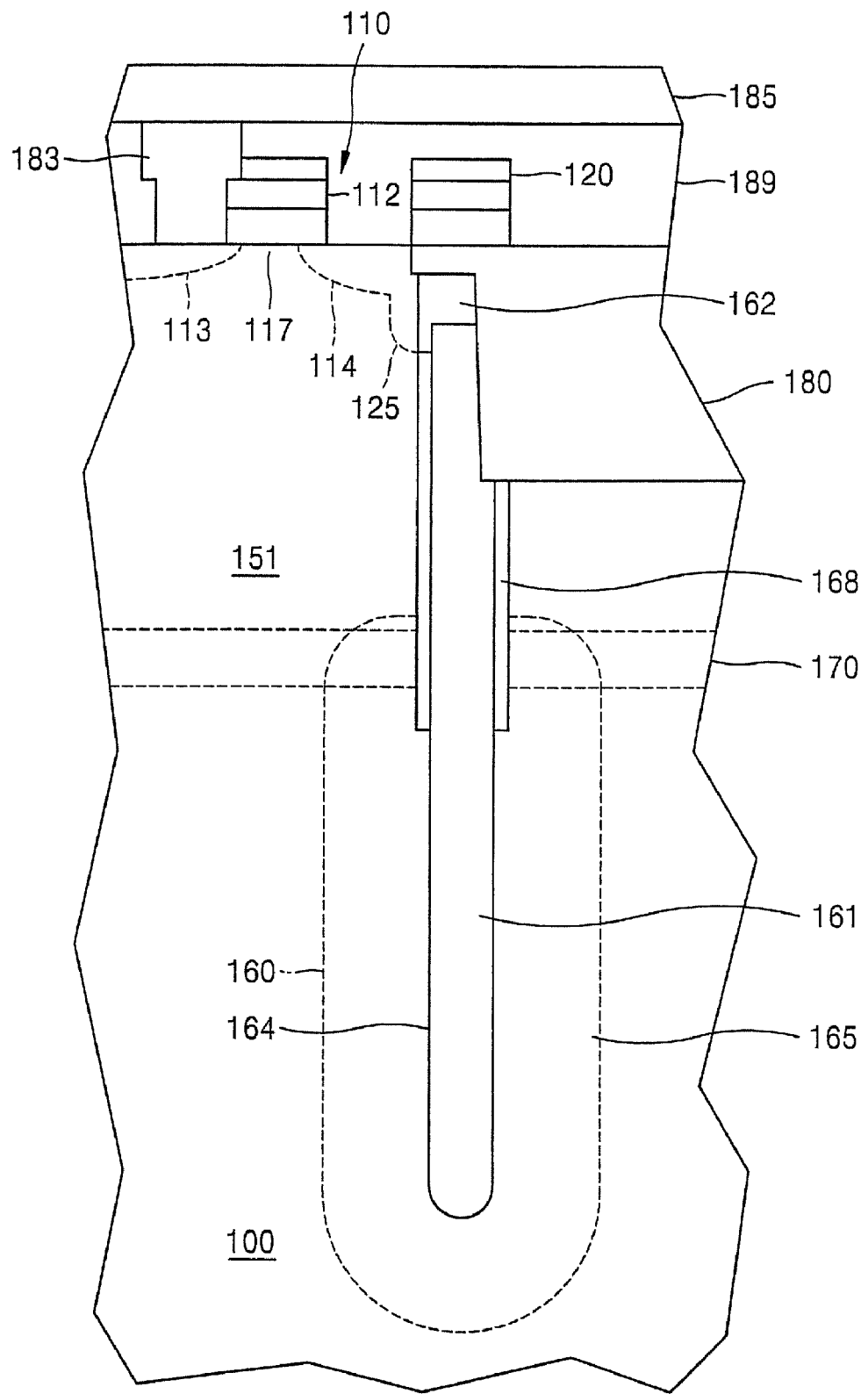
FIG. 1 is a cross-section of a conventional trench capacitor in a dynamic random access memory (DRAM).
Figure 2A:
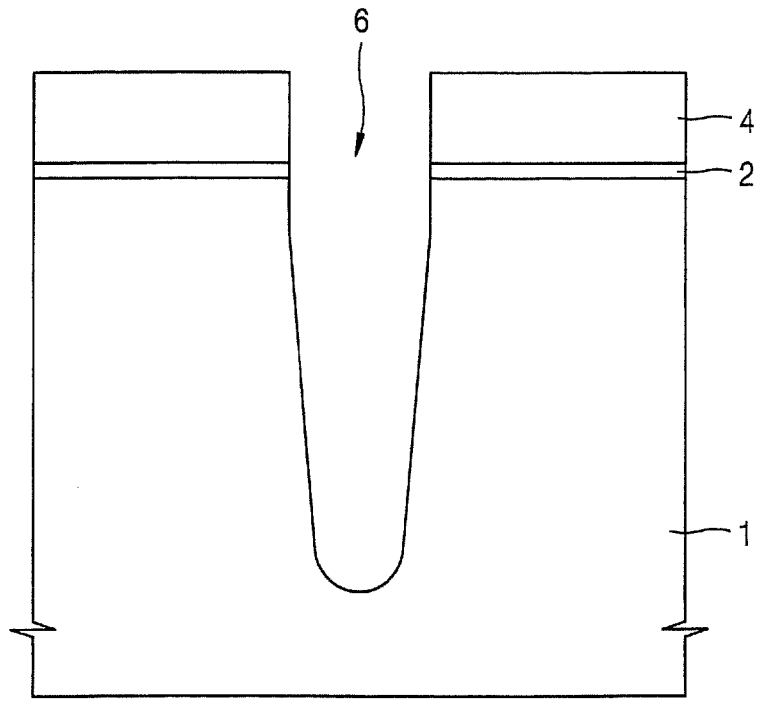
FIGS. 2A through 2D are cross-sections of a conventional process for fabricating a buried plate of the trench capacitor using thermal diffusion.
Figure 2B:
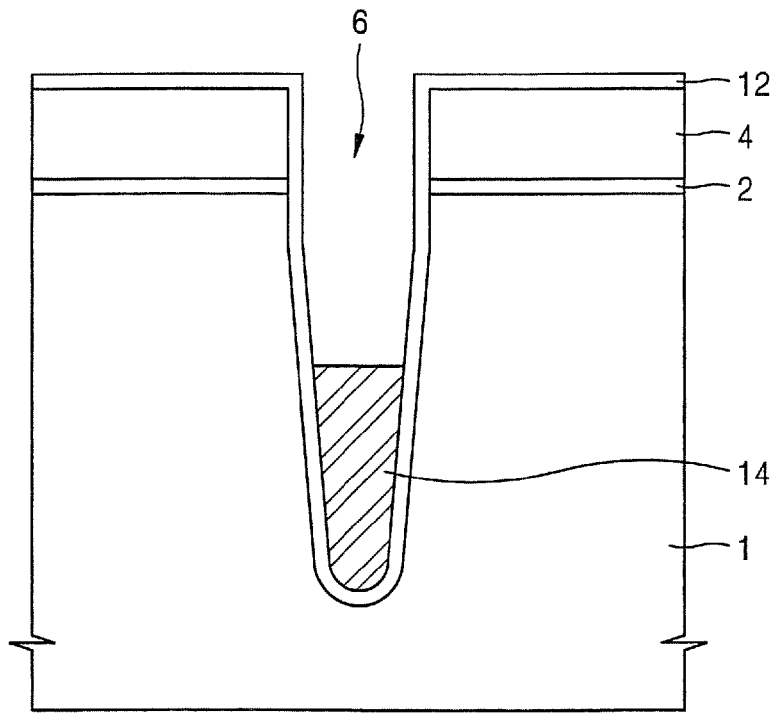
Figure 2C:
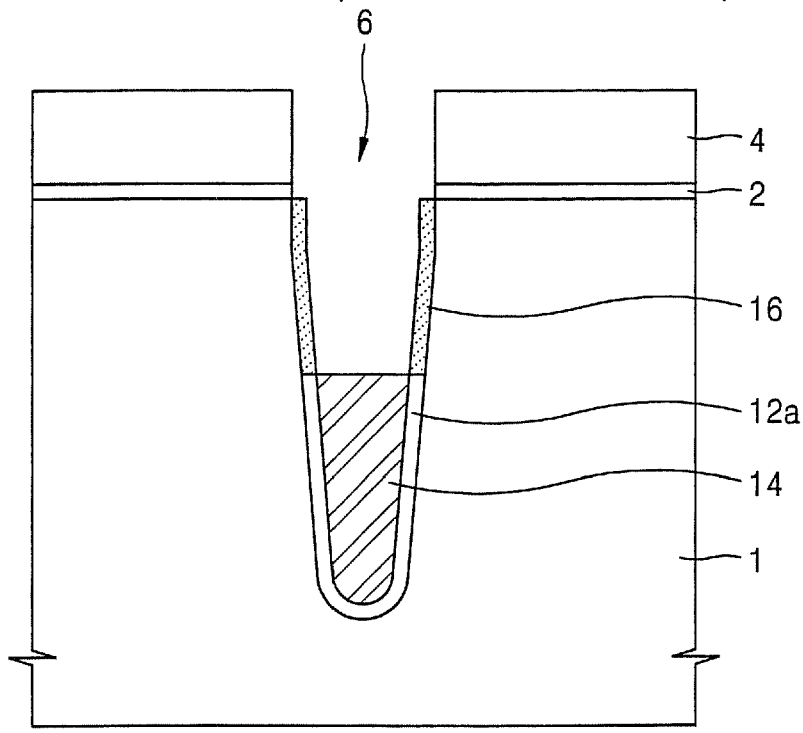
Figure 2D:
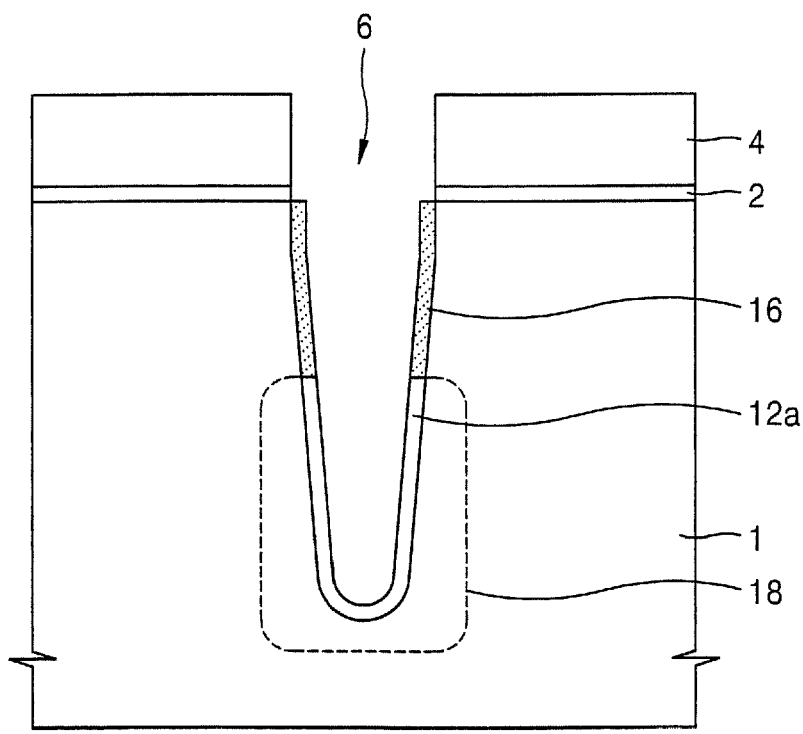

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, film, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, film, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. It will be understood that the terms "film" and "layer" mat be used interchangeably herein.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

FIGS. 4 through 11 are cross-sections of methods of fabricating a trench capacitor according to some embodiments of the present invention. First referring to FIG. 4, an SiGe layer 205 and an Si layer 210 are sequentially formed on a silicon substrate 200. Then, an etching mask 220 with an opening 215 is formed on the Si layer 210.

The SiGe layer 205 and the Si layer 210 may be formed using an epitaxial growth method. The etching selection ratio of the SiGe layer 205 with respect to the Si layer 210 depends on the amount germanium (Ge) included in the SiGe layer 205. The more Ge included in the SiGe layer 205, the faster the SiGe layer 205 is etched. To control the etching, the composition ratio of Ge included in the SiGe layer 205 may be set to less than 20%. The Si layer 210 may be formed as P+ or N+ doped Si layer depending on a conduction type of a transistor. A P+ doped Si layer may be formed by doping an Si layer in-situ with impurities such as boron (B), and an N+ doped Si layer may be formed by doping an Si layer in-situ with impurities such as arsenic (As). When forming the SiGe layer 205 and the Si layer 210, the SiGe layer 205 and the Si layer 210 may be grown by controlling the amount of dopant gas to make the doping concentration different in units of atom layers. Alternatively, or additionally, the P+ or N+ doped Si layer 210 may be doped by ion implantation after forming an Si layer.

The etching mask 220 may be formed of a single layer or a multiple layer of Si, $SiO_2$, $Si_3N_4$, $Al_2O_3$, or $Ta_2O_5$, provided that the combination allows the SiGe layer 205 to be etched faster than the etching mask 220 and the Si layer 210.

Figure 5:
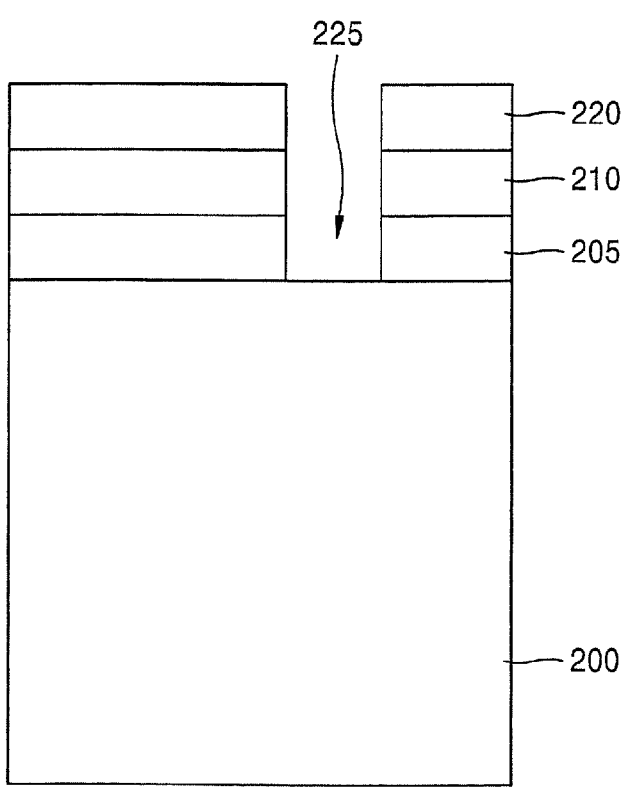

Referring to FIG. 5, a first trench 225 is formed by etching the Si layer 210 and the SiGe layer 205 using the etching mask 220. The Si layer 210 and the SiGe layer 205 may be etched by dry etching, which has an excellent anisotropic characteristic.

Figure 6:
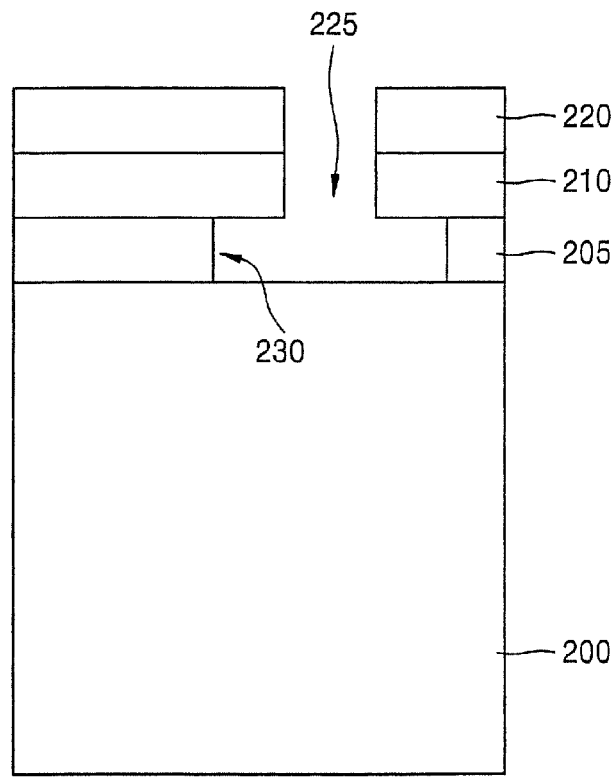

Next, referring to FIG. 6, an undercut 230 is formed inside the SiGe layer 205 by selectively isotropically etching the SiGe layer 205, thereby forming an upside down T-shape together with the first trench 225. The undercut 230 is formed using a process that can selectively etch the SiGe layer 205 with respect to the silicon substrate 200, the Si layer 210, and the etching mask 220. For example, the undercut 230 may be formed by dry etching using gas from the fluorine-based gas, the chlorine-based gas, He, $O_2$, and so on. If the directivity of the gas is decreased, nearly-isotropic etching may be possible. Alternatively, the undercut 230 may be formed by wet etching using a mixture of nitric acid, acetic acid, and hydrofluoric acid. Accordingly, this process may be able to selectively remove only the SiGe layer 205 without damaging Si, $SiO_2$ and $Si_3N_4$, which may be used for the etching mask 220, and the silicon substrate 200, because the SiGe layer 205 is etched more readily than Si, $SiO_2$, and $Si_3N_4$.

Figure 7:
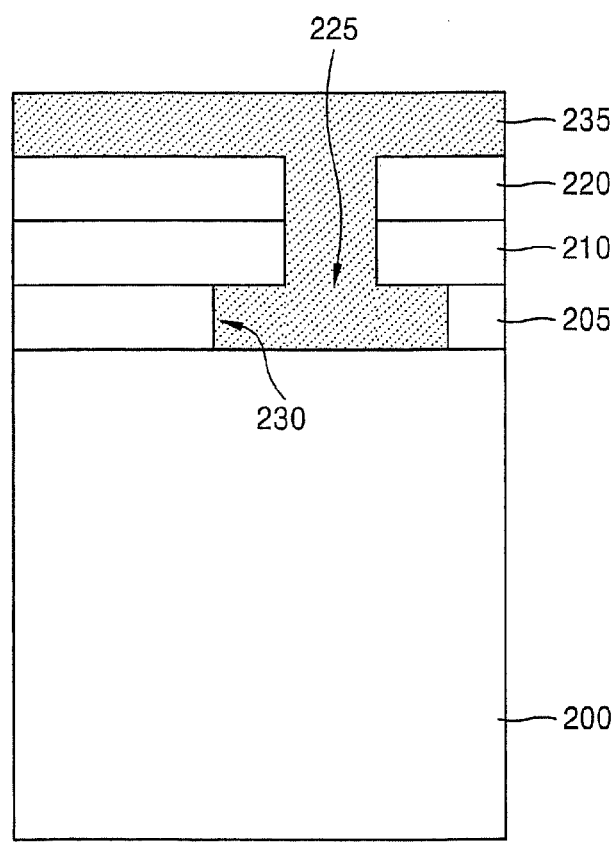

As illustrated in FIG. 7, an insulating layer 235 is formed on the resultant structure including the undercut 230. The insulating layer 235 may be deposited using atomic layer deposition (ALD), chemical vapor deposition (CVD), plasma enhanced ALD (PEALD), plasma enhanced CVD (PECVD), and/or a coating method, and may be formed using a silicon oxide layer. By increasing step coverage, the insulating layer 235 may be formed inside the undercut 230. FIG. 7 shows an example of the insulating layer 235 with a thickness that completely buries the first trench 225. However, an insulating layer 235 may be formed to have a thickness that does not completely bury the first trench 225.

Figure 8:
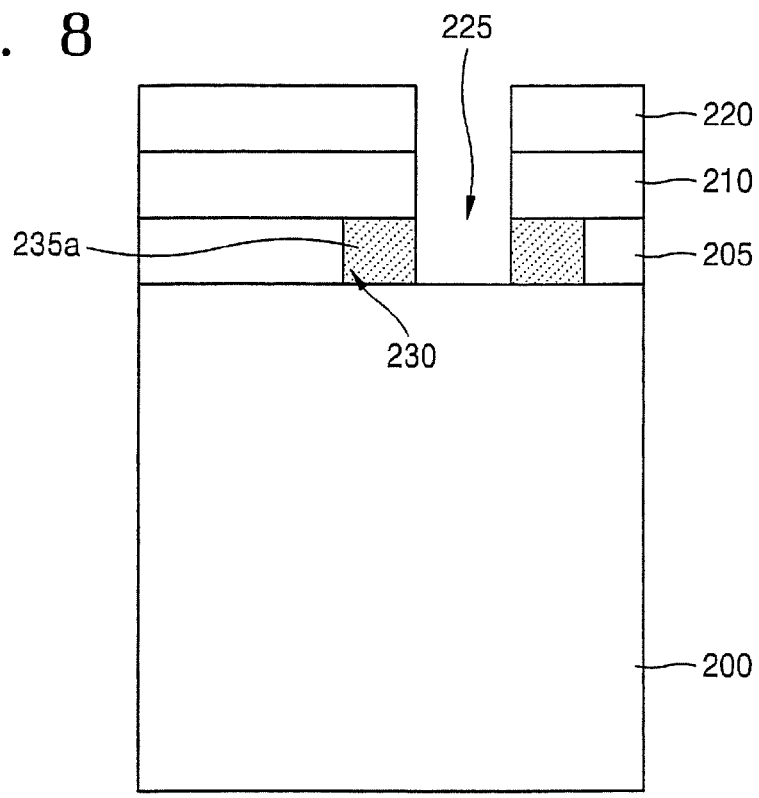
Figure 9:
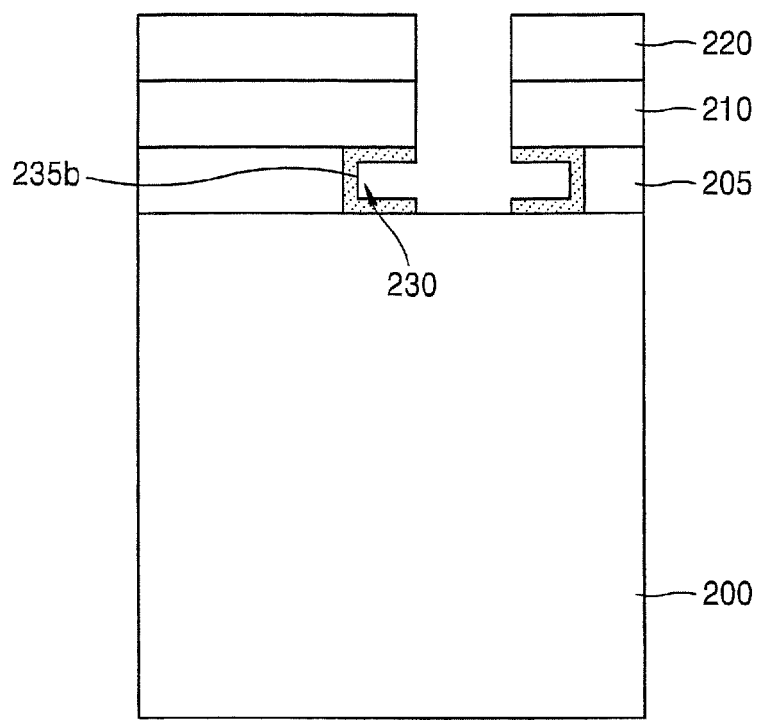
Figure 10:
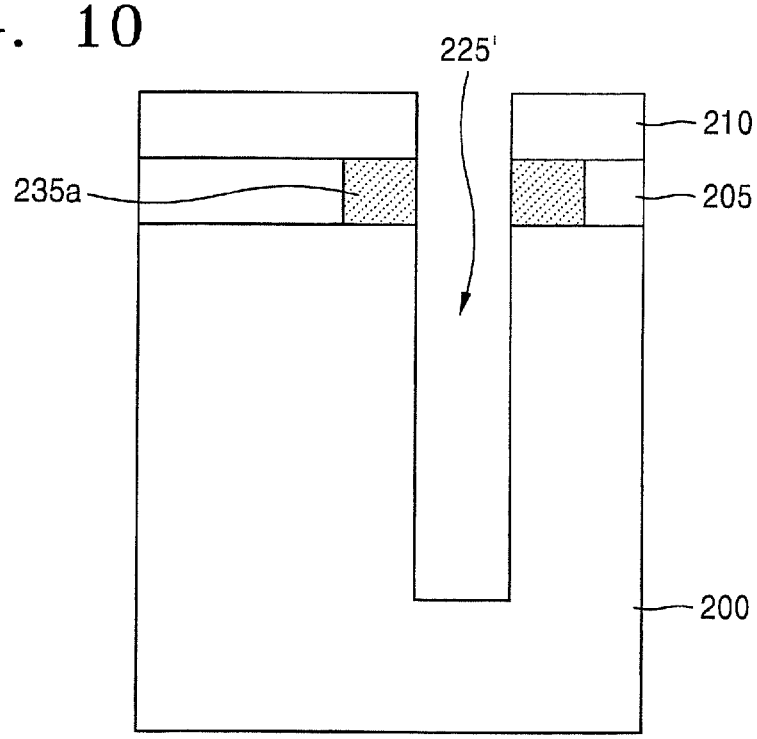

Referring to FIG. 8, an insulating layer collar 235a is formed in the undercut 230 by anisotropically etching the insulating layer 235 of FIG. 7. The thickness of the insulating layer collar 235a formed in the undercut 230 can be controlled by controlling the amount of etching of the SiGe layer 205 in the operation shown in FIG. 7. Therefore, it is possible to form the insulating layer collar 235a to have a large thickness by increasing the depth of the undercut 230, and, accordingly, current leakage between the conventional buried plate and buried strap may be reduced. If the insulating layer 235 is formed with a thickness that does not completely bury the first trench 225 in the operation shown in FIG. 7, a concave insulating layer collar can be formed, such as that illustrated in FIG. 9 by insulating layer collar 235b. Referring to FIG. 10, a second trench 225', which is an extension of the first trench 225, is formed by etching the silicon substrate 220 using the etching mask 220 of FIG. 8. The etching mask 220 is then removed.

Figure 11:
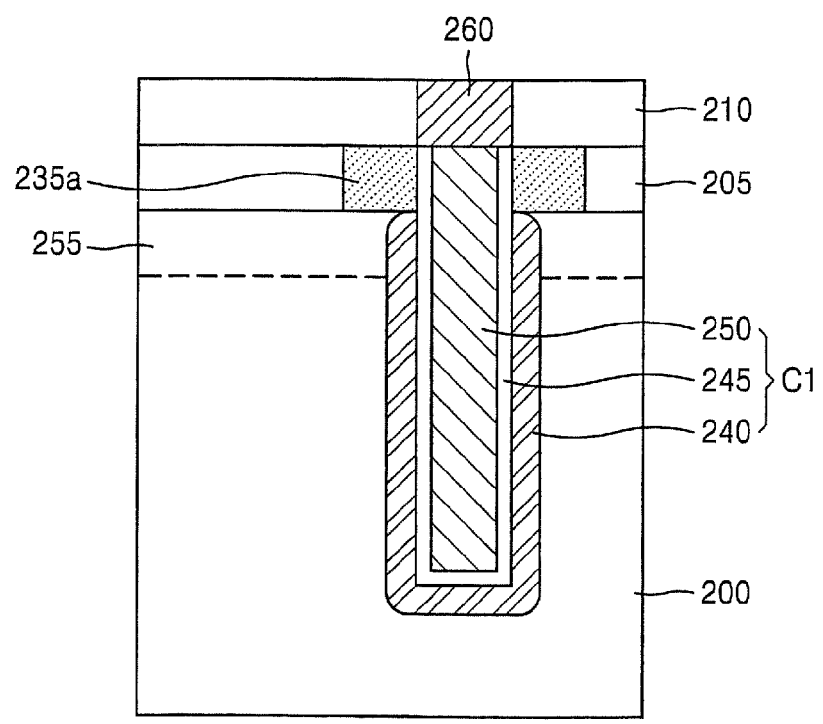

A buried plate 240 covering the outside of the second trench 225' is formed. The buried plate 240 may be formed using a process that includes, for example, thermal diffusion, gas phase doping, or plasma immersion ion implantation. A dielectric layer 245 is formed on the inner wall and bottom of the second trench 225', and a storage electrode 250 is formed inside the second trench 225'. An operation of recessing the dielectric layer 245 and the storage electrode 250 may be further included. For example, the top of the dielectric layer 245 and the storage electrode 250 may be recessed until parallel with the top of the insulating layer collar 235a. As a result, a trench capacitor C1 that includes the buried plate 240, the dielectric layer 245, and the storage electrode 250 is formed. The storage electrode 250 may be made of tungsten silicide, tungsten, tungsten nitride, ruthenium, ruthenium oxide, iridium, and/or iridium oxide. A buried N+ well 255 and a buried strap 260 may then be formed as illustrated in FIG. 11.

Figure 3A:
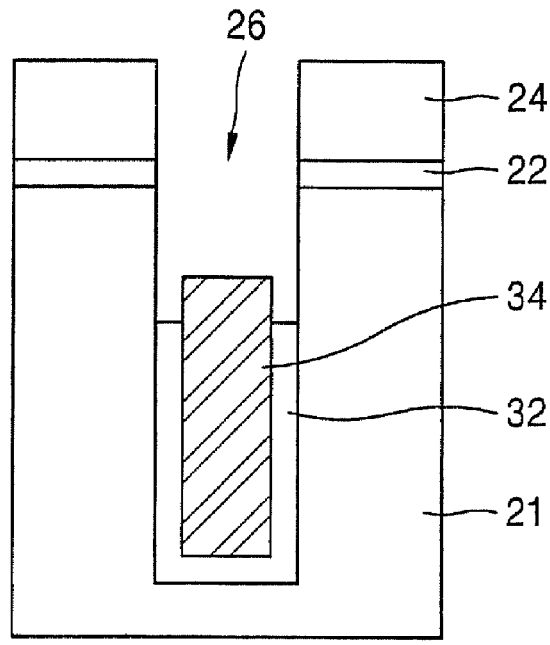
FIGS. 3A through 3C are cross-sections of a conventional process for fabricating a buried plate using gas phase doping or plasma immersion ion implantation.
Figure 3B:
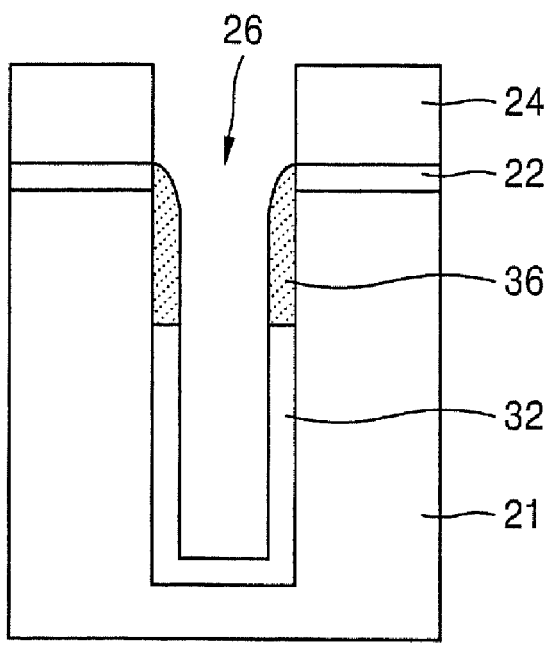
Figure 3C:
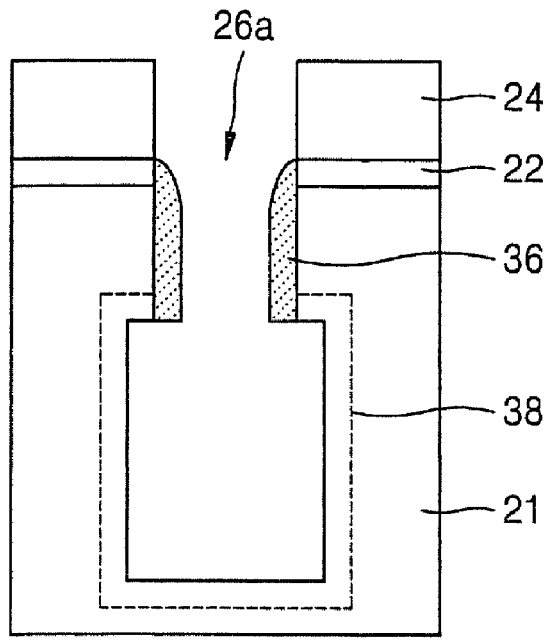
Figure 3D:
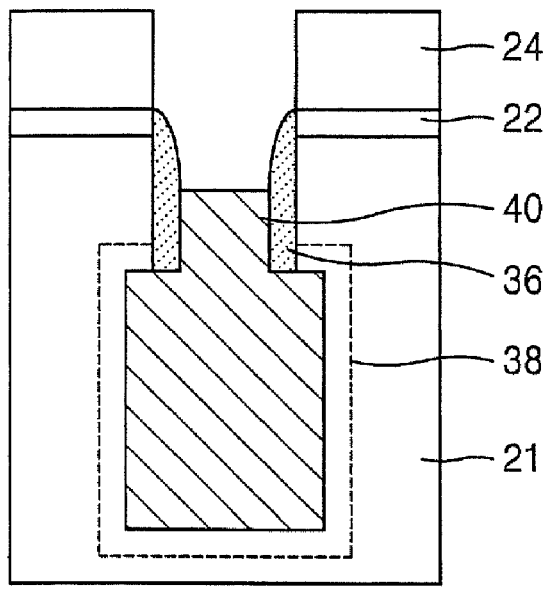
FIGS. 3D through 3F are cross-sections of a conventional process for fabricating a buried strap.
Figure 3E:
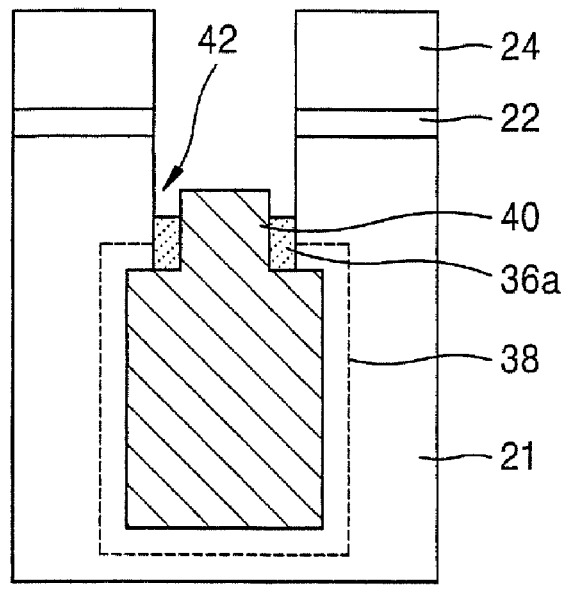
Figure 3F:
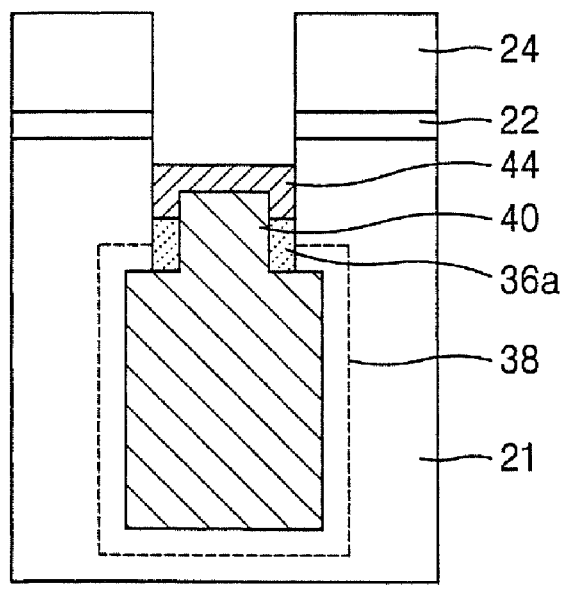
Figure 4:
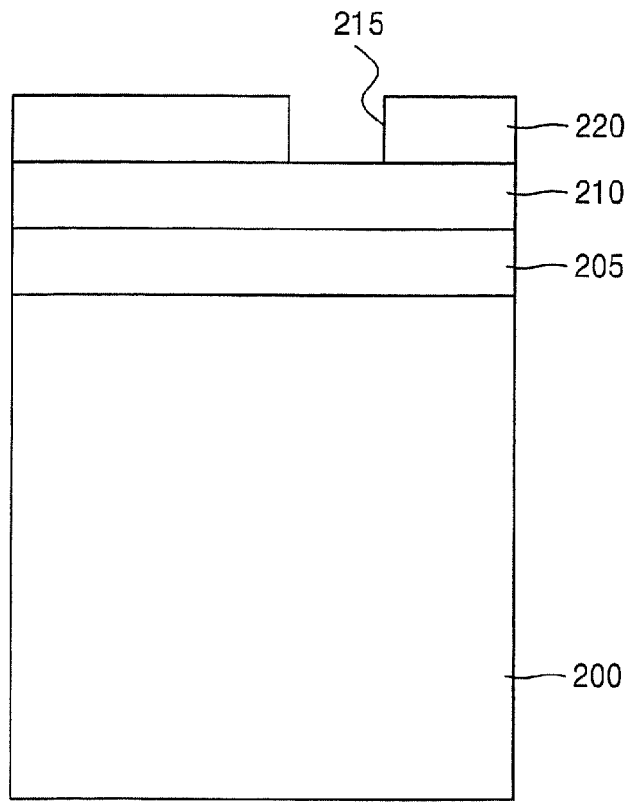
FIGS. 4 through 11 are cross-sections of a process for fabricating a trench capacitor according to some embodiments of the present invention.

According to the conventional process that is shown in FIG. 3E, an additional process is needed to remove the collar 36 (see FIG. 3D) from the region 42 on which the buried strap 44 (see FIG. 3F) is to be formed. However, according to some embodiments of the present invention, the process for forming the trench capacitor C1 may be simplified because the insulating layer collar 235a can be formed a predetermined distance away from the top surface of a device (the Si layer 210 in the present embodiment), and the region on which the buried strap 260 is to be formed does not need to be at least partially removed to properly position the buried strap 260.

The trench capacitor C1 that is formed by the above-described process can include the silicon substrate 200 with the SiGe layer 205 and the Si layer 210 stacked sequentially, and the trench 225' (see FIG. 10) formed inside the SiGe layer 205, the Si layer 210, and the silicon substrate 200. The undercut 230 (see FIG. 8) extends from the trench 225' within the SiGe layer 205, and the insulating layer collar 235a is formed within the undercut 230. The trench capacitor C1 includes the buried plate 240, which is inside the silicon substrate 200 along the trench 225', the dielectric layer 245 on the inner wall and bottom of the trench 225', and the storage electrode 250 inside the trench 225'. The dielectric layer 245 and the storage electrode 250 extend beyond and away from an adjacent top major surface of the silicon substrate 200, such that the top surfaces of the dielectric layer 245 and the storage electrode 250 are higher than the top surface of the silicon substrate 200.

The trench capacitor C1 of the present embodiment may substantially reduce current leakage because the insulating layer collar 235a is thicker than an insulating layer collar that may be formed by a conventional process.

A transistor can be formed on top of the Si layer 210, and a node diffusion region electrically connecting a source/drain of the transistor and the storage electrode 250 can be formed using the buried strap 260. When an Si layer 210 is formed as an epitaxial layer, the transistor formed thereon may have improved characteristics because of the crystalline qualities of the epitaxial layer.

Figure 12:
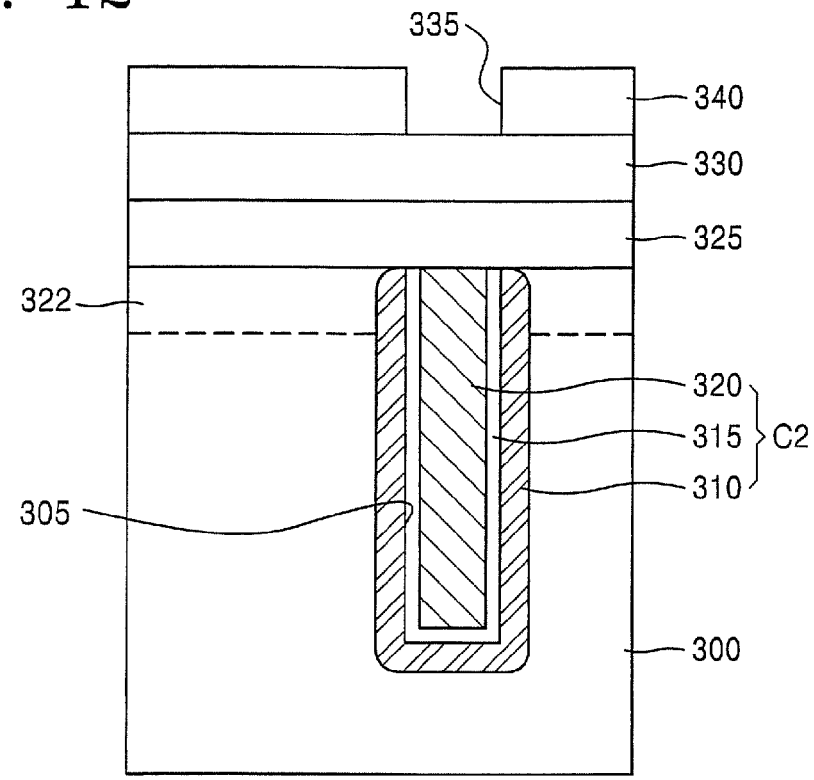
FIGS. 12 though 17 are cross-sections of a process for fabricating a trench capacitor according to some other embodiments of the present invention.

FIGS. 12 though 17 are cross-sections of processes for fabricating a trench capacitor according to some other embodiments of the present invention. In contrast to the previous process explained with regard to FIGS. 4-11, in the present embodiments, a trench capacitor is formed before an insulating layer collar is formed. To simplify the description, processes that are the same as those described above in the previous embodiments of the present invention will not be repeated below.

Referring to FIG. 12, after a lower trench 305 is formed inside a silicon substrate 300, a buried plate 310 covering the outer side wall and bottom of the trench 305 is formed. The buried plate 310 may be formed using a method such as thermal diffusion, gas phase doping, and/or plasma immersion ion implantation. A trench capacitor C2 is formed by forming a dielectric layer 315 on the inner wall and bottom of the lower trench 305 and forming a storage electrode 320 inside the lower trench 305. A buried N+ well 322 is additionally formed. An SiGe layer 325 and an Si layer 330 are stacked sequentially on top of the silicon substrate 300 including the storage electrode 320. Then, an etching mask 340 with an opening 335 is formed on the Si layer 330.

Figure 13:
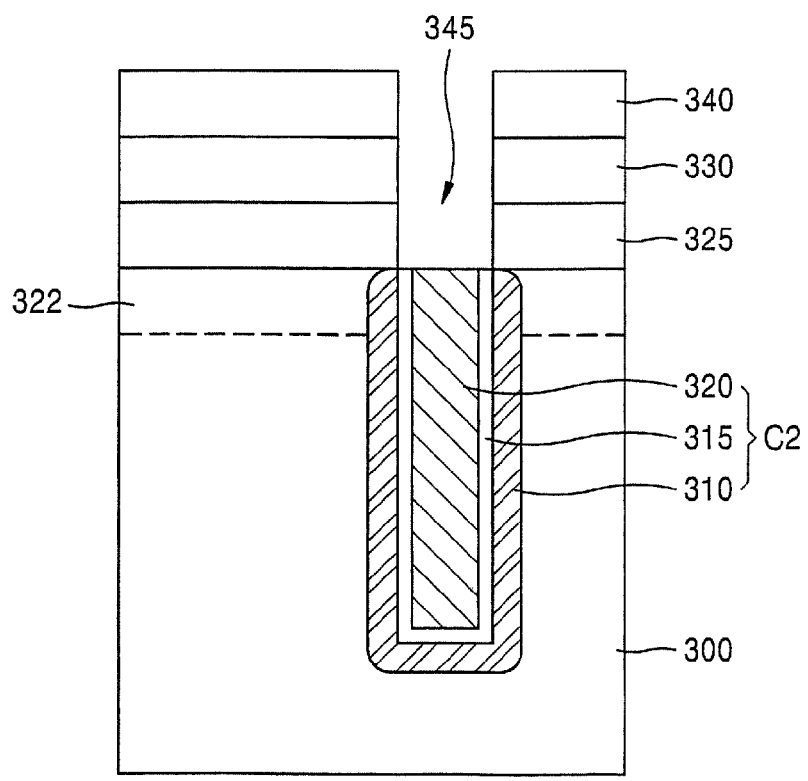

Referring to FIG. 13, an upper trench 345 is formed by etching the Si layer 330 and the SiGe layer 325 using the etching mask 340.

Figure 14:
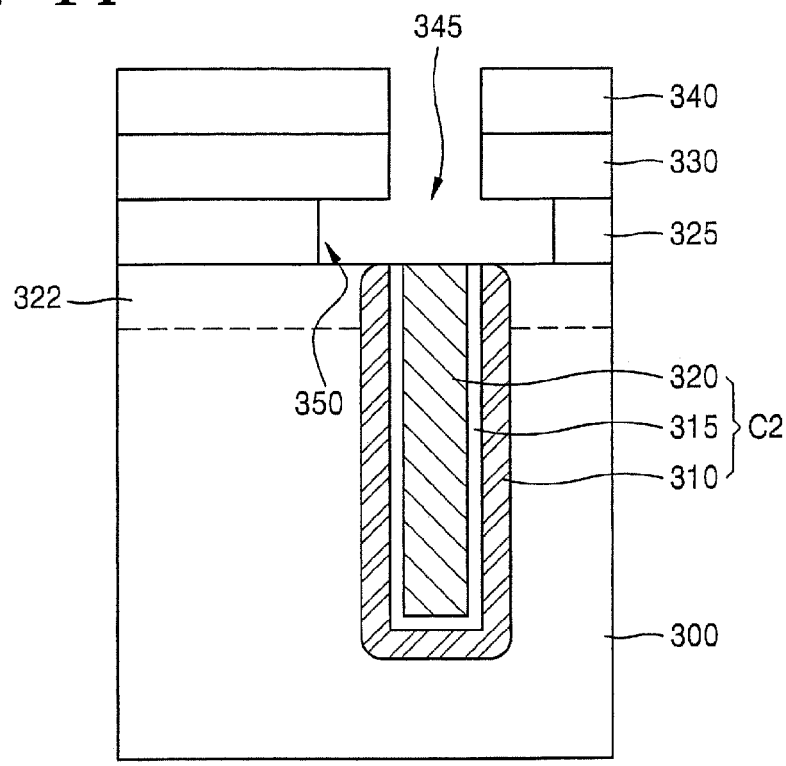

Referring to FIG. 14, an undercut 350 is formed inside the SiGe layer 325 by selectively, isotropically etching the SiGe layer 325.

Figure 15:
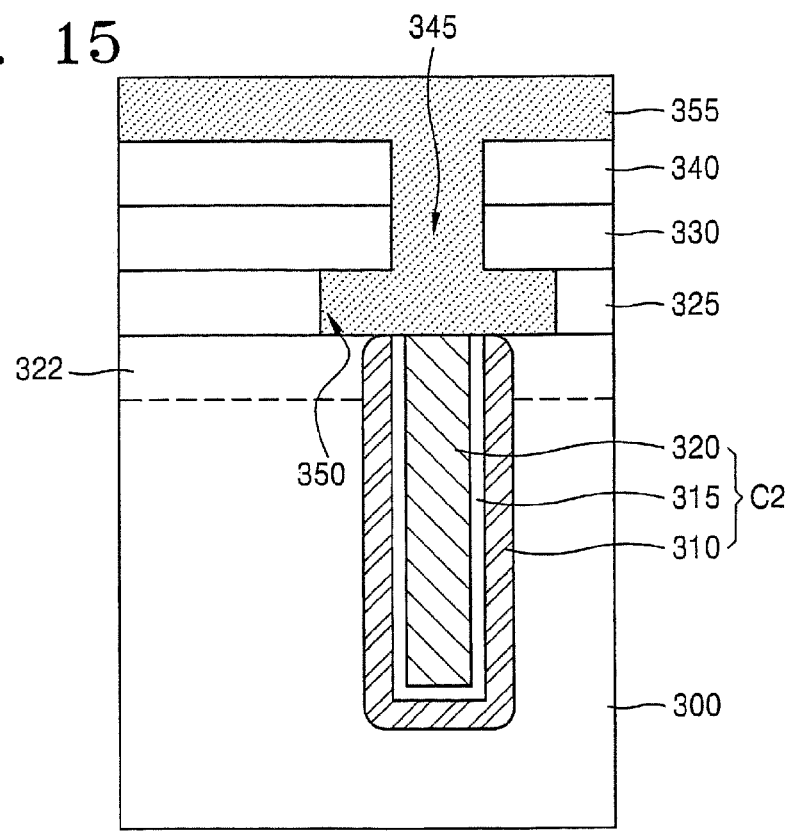

Referring to FIG. 15, an insulating layer 355 is formed on the resultant structure including the undercut 350. The insulating layer 355 is formed to a thickness that may or may not bury the upper trench 345.

Figure 16:
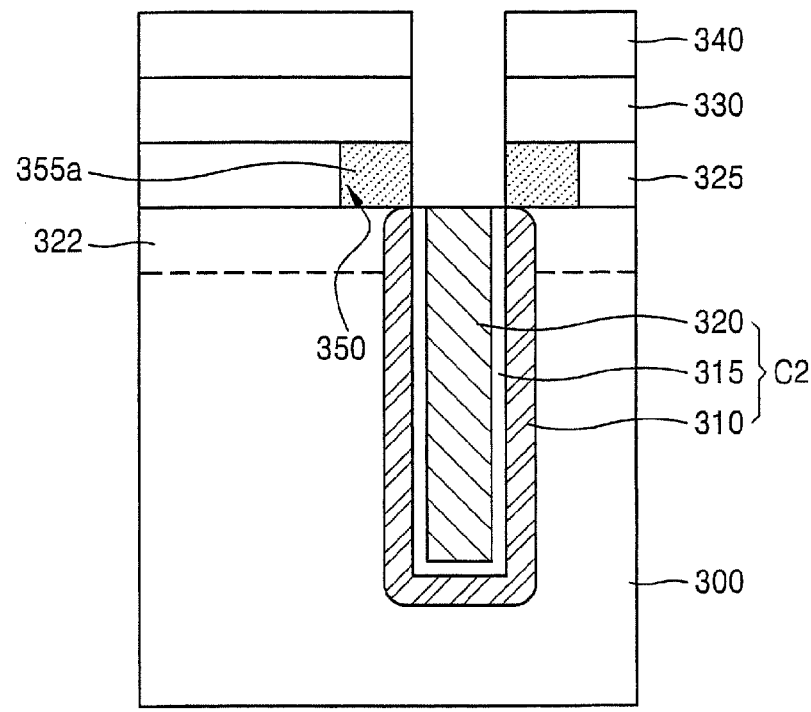

Referring to FIG. 16, an insulating layer collar 335a is formed inside the undercut 350 by anisotropically dry etching the insulating layer 355.

Figure 17:
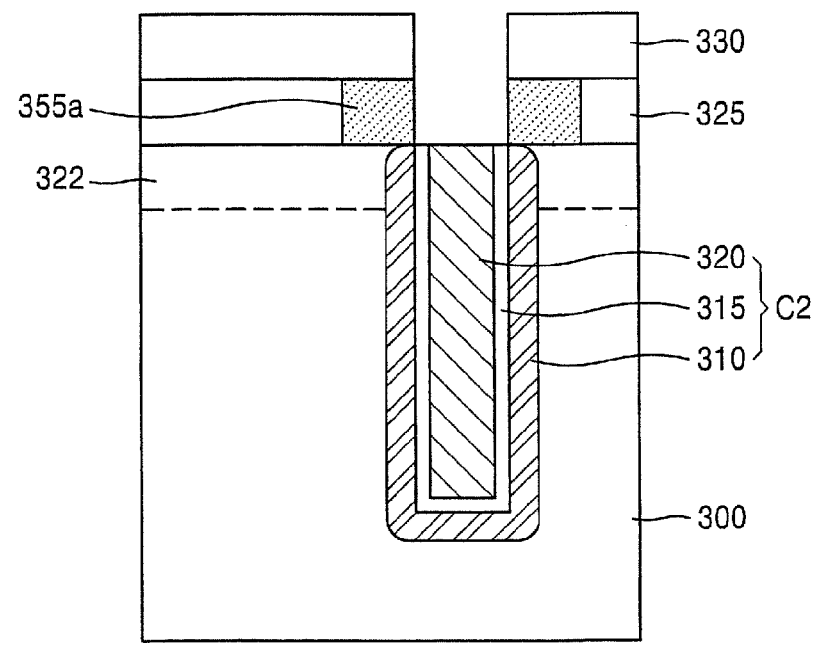

Referring to FIG. 17, the etching mask 340 is removed.

Using the above-described processes, the trench capacitor C2 can be formed so that the top of the dielectric layer 315 and the storage electrode 320 are aligned with an adjacent top major surface of the silicon substrate 300.

FIGS. 18 through 24 are cross-sections of processes for fabricating a trench capacitor according to yet other embodiments of the present invention. In the embodiments shown in FIGS. 18 through 24, only the process for forming a buried plate of the trench capacitor is different from the embodiments shown in FIGS. 4-11. Details of the present embodiment that are not described below are the same as explained with regard to the embodiments shown in FIGS. 4-11. Although the embodiments shown in FIGS. 18 through 24 show a first conduction type is N+ and a second conduction type is P+, it is to be understood that the first conduction type may be P+ and the second conduction type may be N+.

Figure 18:
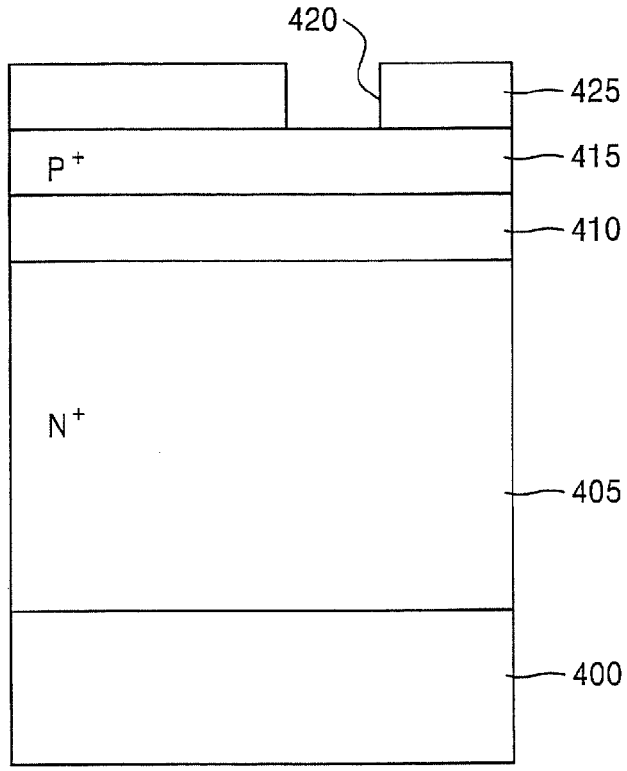
FIGS. 18 through 24 are cross-sections of a process for fabricating a trench capacitor according to yet other embodiments of the present invention.

Referring to FIG. 18, a first conduction type (N+) doped Si layer 205, an SiGe layer 410, and a second conduction type (P+) doped Si layer 415 are sequentially formed on top of a silicon substrate 400. The N+-doped Si layer 405, the SiGe layer 410, and the P+-doped Si layer 415 may be formed by an epitaxial growth method. Next, an etching mask 425 with an opening 420 is formed on top of the P+-doped Si layer 415.

Figure 19:
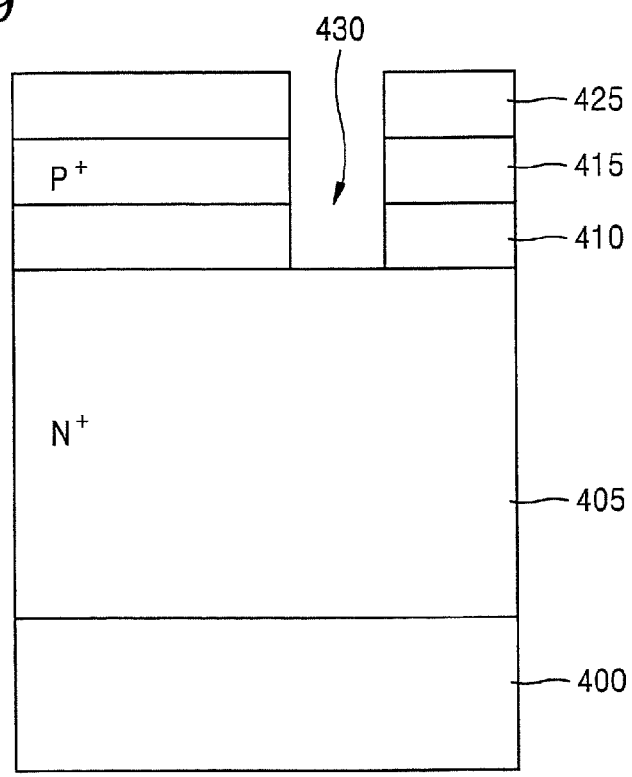

Referring to FIG. 19, a first trench 430 is formed by etching the P+-doped Si layer 415 and the SiGe layer 410 using the etching mask 425.

Figure 20:
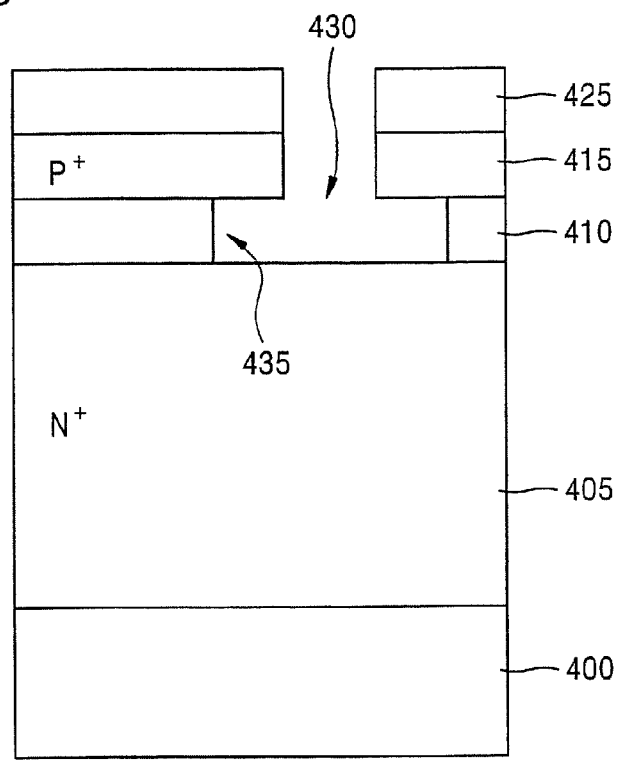

Referring to FIG. 20, an undercut 435 is formed in the SiGe layer 410 by selectively, isotropically etching the SiGe layer 410.

Figure 21:
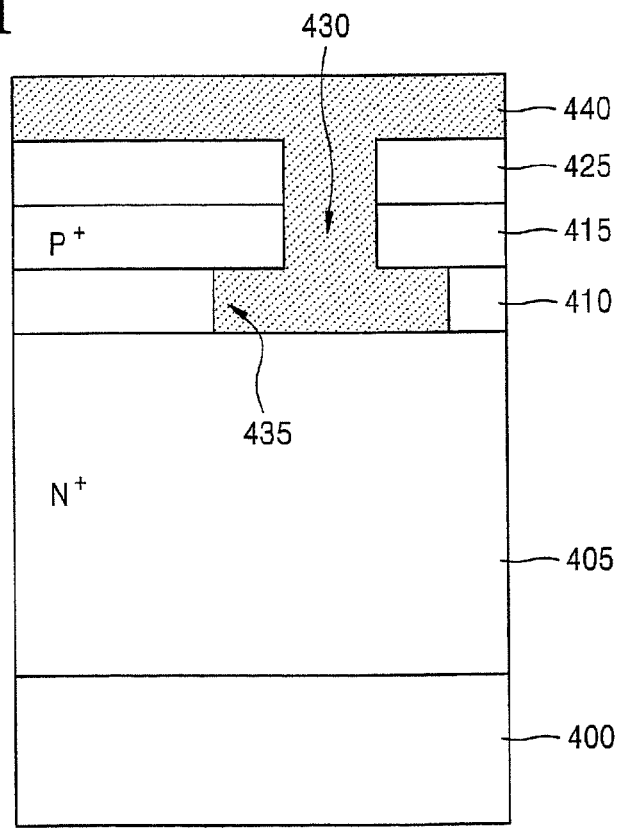

Referring to FIG. 21, an insulating layer 440 is formed on the resultant structure including the undercut 435.

Figure 22:
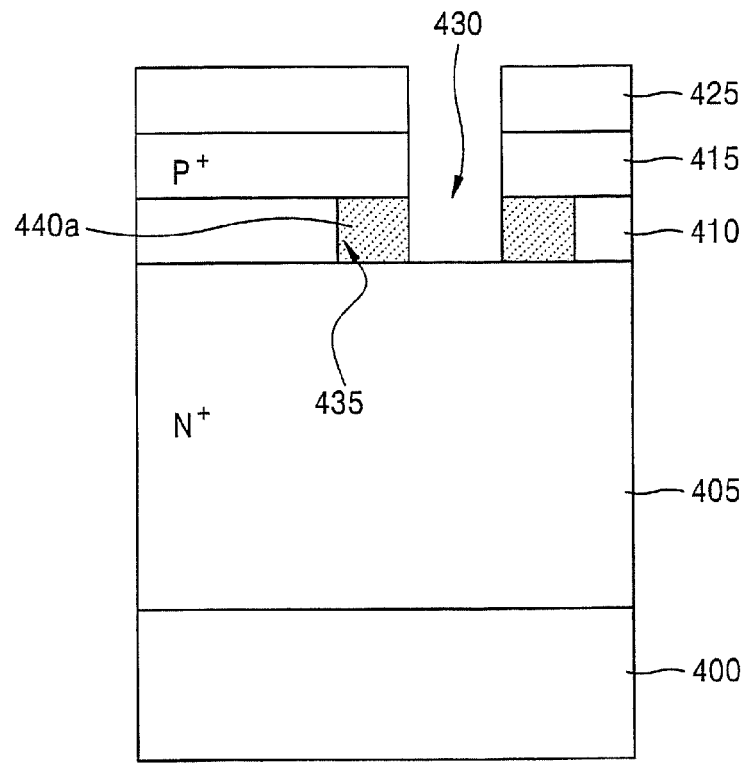

Referring to FIG. 22, an insulating layer collar 440a is formed inside the undercut 435 by anisotropically dry etching the insulating layer 440.

Figure 23:
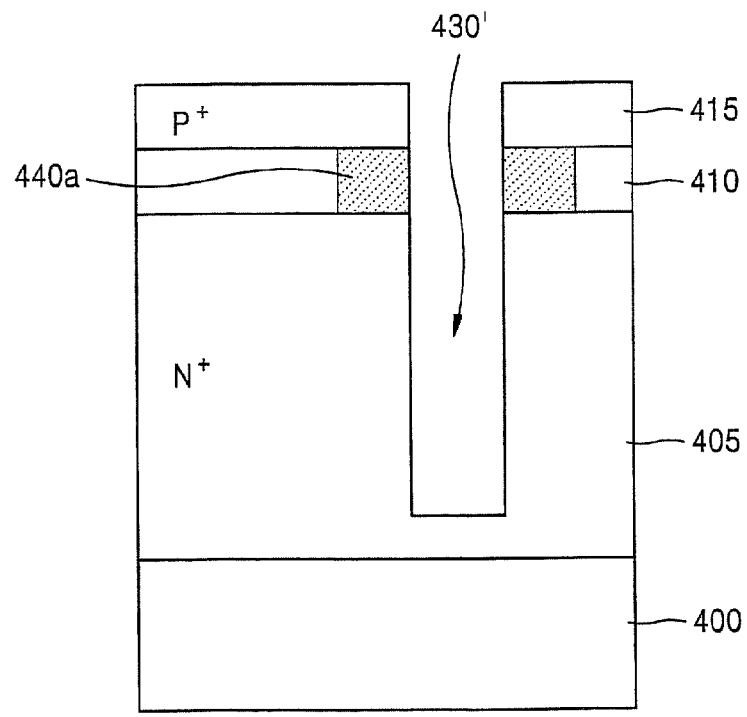

A second trench 430' extending from the first trench 430 (see FIG. 22) is formed by etching the N+-doped Si layer 405 using the etching mask 425. FIG. 23 illustrates a state in which the etching mask 425 is removed. Here, the N+-doped Si layer 405 exposed as the inner wall and bottom of the second trench 430' is itself a buried plate, without having to be doped using thermal diffusion, ion implantation, etc. as in the conventional art.

Figure 24:
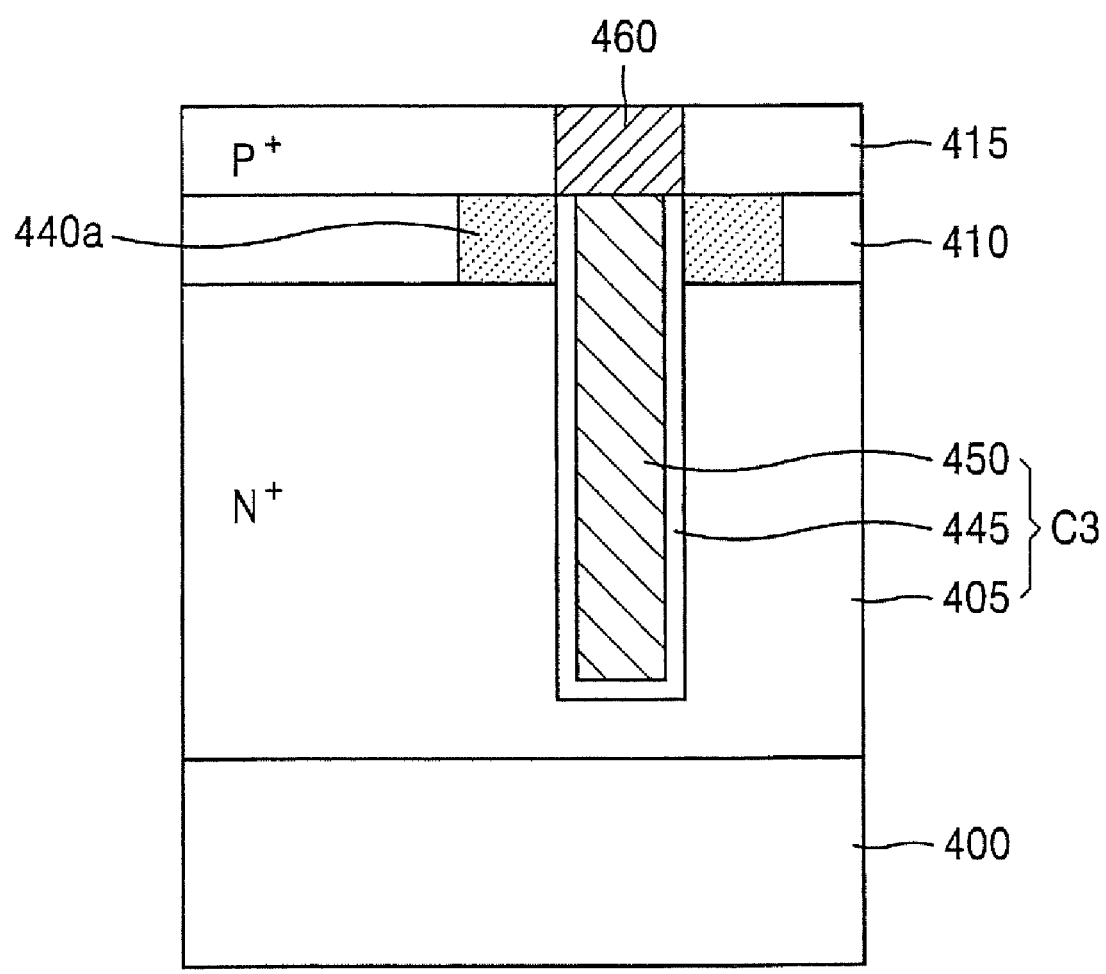

Afterwards, as illustrated in FIG. 24, a dielectric layer 445 is formed on the inner wall and bottom of the second trench 430' and a storage electrode 450 is formed inside the second trench 430'. This process may further include recessing the dielectric layer 445 and the storage electrode 450. For example, the dielectric layer 445 and the storage electrode 450 may be recessed until the top of the dielectric layer 445 and the storage electrode 450 are aligned with the top surface of the insulating layer collar 440a. Accordingly, the trench capacitor C3 can include the buried plate (N+-doped Si layer 405), the dielectric layer 445, and the storage electrode 450 is completed. A buried strap 460 may then be formed.

The present process may further simplify the process for forming the trench capacitor C3, because after etching the second trench 430', a further process for doping and ion implantation to form the buried plate can be omitted. In addition, the process may be simpler because the buried plate and a buried well do not need to be formed separately by epitaxially growing the N+-doped Si layer 405 and the P+-doped Si layer 415.

The trench capacitor C3 formed using the process of the embodiments of FIGS. 18 through 24 includes the silicon substrate 400 having the N+-doped Si layer 405, the SiGe layer 410, and the P+-doped Si layer 415 stacked sequentially, and the second trench 430' (see FIG. 23) formed inside the silicon substrate 400, the P+-doped Si layer 415, the SiGe layer 410, and the N+-doped Si layer 405. The undercut 435 is formed on the outside of the trench 430 and inside the SiGe layer 410, and the insulating layer collar 440a is formed inside the undercut 435. The N+-doped Si layer 405 covering the outside and bottom of the second trench 430' is the buried plate. The dielectric layer 445 is formed on the inner wall and bottom of the second trench 430' and the storage electrode 450 is formed in the second trench 430'. The tops of the dielectric layer 445 and the storage electrode 450 are higher than the surface of the N+-doped Si layer 405.

The conventional process described with regard to FIGS. 1-3F may not adequately prevent current leakage because the insulating layer collar that is formed using, for example, local oxidation of silicon (LOCOS), may not have a sufficient thickness. In addition, the convention process may be more complex because an additional process to remove top portions of the insulating layer collar can be needed before forming a buried strap. In contrast, by some embodiments of the present invention, the insulating layer collar is formed in an undercut where the thickness may be controlled by controlling the depth of the undercut, such as by adjusting an etching selection ratio of an SiGe layer. A thicker insulating layer collar may thereby be obtained, which may reduce current leakage. Furthermore, because the insulating layer collar may more easily be formed at a desired location, a buried strap may be formed thereon without first removing a portion of the region on which it is to be formed, which may simplify the process for forming the trench capacitor.

Electrical characteristics of the trench capacitor may be improved by epitaxially growing the transistor of the capacitor on a silicon substrate. In addition, the process may be further simplified by forming a trench by epitaxially growing a N+ doped Si layer on top of the silicon substrate so that a buried plate and a buried N+ well can be formed at the same time.

While this invention has been particularly shown and described with reference to embodiments thereof, the preferred embodiments should be considered in descriptive sense only and not for purposes of limitation. Therefore, the scope of the invention is defined not by the detailed description of the invention but by the appended claims.

What is claimed is:

1. A trench capacitor, comprising:
   a silicon substrate;
   a first conduction type-doped Si layer on the silicon substrate;
   an SiGe layer on the first conduction type-doped Si layer;
   a second conduction type-doped Si layer on the SiGe layer opposite to the first conduction type-doped Si layer;
   a trench defined in the second conduction type-doped Si layer, the SiGe layer, and the first conduction type-doped Si layer;
   an undercut region defined in the SiGe layer and extending laterally along the first and second conduction type-doped Si layers;
   an insulating layer collar in the undercut region that extends laterally along the first and second conduction type-doped Si layers;
   a buried plate in the first conduction type-doped Si layer along the trench;
   a dielectric layer in the trench on the buried plate; and
   a storage electrode on the dielectric layer in the trench opposite to the buried plate.

2. The trench capacitor of claim 1, wherein top surfaces of the dielectric layer and the storage electrode extend beyond and away from an adjacent top surface of the first conduction type-doped Si layer.

* * * * *